(12) United States Patent
Mochizuki

(10) Patent No.: US 12,745,541 B2
(45) Date of Patent: Sep. 22, 2026

(54) ELECTRONIC MODULE, DISPLAY DEVICE, PHOTOELECTRIC CONVERSION DEVICE, ELECTRONIC APPARATUS, ILLUMINATION DEVICE, MOVING BODY, AND WEARABLE DEVICE

(71) Applicant: CANON KABUSHIKI KAISHA, Tokyo (JP)

(72) Inventor: Katsuhisa Mochizuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 469 days.

(21) Appl. No.: 18/299,952

(22) Filed: Apr. 13, 2023

(65) Prior Publication Data

US 2023/0345797 A1 Oct. 26, 2023

(30) Foreign Application Priority Data

Apr. 26, 2022 (JP) ................................ 2022-072671

(51) Int. Cl.

| | |
|---|---|
| ***H10K 59/80*** | (2023.01) |
| ***F21S 43/13*** | (2018.01) |
| ***G02B 27/01*** | (2006.01) |
| ***G03B 13/02*** | (2021.01) |
| *F21V 3/00* | (2015.01) |
| *F21Y 115/20* | (2016.01) |

(52) U.S. Cl.

CPC ............ *H10K 59/872* (2023.02); *F21S 43/13* (2018.01); *G02B 27/0172* (2013.01);

(Continued)

(58) Field of Classification Search

CPC .. H10K 59/872; H10K 59/8722; H10K 59/12; F21S 43/13; F21S 43/145;

(Continued)

(56) References Cited

U.S. PATENT DOCUMENTS

2005/0046622 A1 3/2005 Nakanishi
2007/0040798 A1* 2/2007 Kawai .................... G02F 1/167 345/107

(Continued)

FOREIGN PATENT DOCUMENTS

CN 103081156 A 5/2013
JP 2003-197056 A 7/2003

(Continued)

OTHER PUBLICATIONS

May 11, 2026 Japanese Official Action in Japanese Patent Appln. No. 2022-072671.

*Primary Examiner* — Mariam Qureshi
(74) *Attorney, Agent, or Firm* — Venable LLP

(57) ABSTRACT

An electronic module comprises a first substrate, a second substrate, a third substrate, a joint member, a frame member, and a reinforcement member. An electronic element is arranged on the first substrate. An electrical terminal is provided on a peripheral portion of the first substrate. The joint member joins the first substrate and the second substrate. The third substrate is electrically connected to the electrical terminal of the first substrate. The frame member includes a wall portion surrounding a part of the first substrate and a part of the second substrate, and a contact portion having a convex shape and contacting the second substrate. The reinforcement member is arranged at a point where the electrical terminal and the third substrate are connected.

20 Claims, 8 Drawing Sheets

(52) U.S. Cl.
CPC ................ *G03B 13/02* (2013.01); *F21V 3/00* (2013.01); *F21Y 2115/20* (2016.08); *G02B 2027/0178* (2013.01)

(58) Field of Classification Search
CPC .... F21S 43/255; F21S 43/26; G02B 27/0172; G02B 2027/0178; G02B 27/017; G03B 13/02; F21V 3/00; F21V 23/003; F21Y 2115/20; F21Y 2115/15; F21W 2103/35; B60Q 1/268; B60Q 1/5035; G02F 1/133612; G02F 1/13452; H05K 1/02; H05K 1/14
See application file for complete search history.

(56) References Cited

U.S. PATENT DOCUMENTS

2011/0222303 A1* 9/2011 Tokida .................. F21S 41/155 362/516
2013/0126858 A1 5/2013 Boerner
2014/0014960 A1 1/2014 Yamazaki
2016/0043344 A1 2/2016 Shin
2016/0268542 A1* 9/2016 Suzuki ................. H10K 59/131
2018/0004330 A1* 1/2018 Kim ................... H10K 59/8791
2021/0273203 A1 9/2021 Sano
2021/0341788 A1* 11/2021 Lee ................... G02F 1/133612
2022/0163806 A1* 5/2022 Chaum .................. G02B 30/40

FOREIGN PATENT DOCUMENTS

JP 2003-243636 A 8/2003
JP 2005-115728 A 4/2005
JP 2010-256668 A 11/2010
JP 2011-253947 A 12/2011
JP 2014-178614 A 9/2014
JP 2020-160469 A 10/2020
JP 2021-087032 A 6/2021
JP 2021-136207 A 9/2021

* cited by examiner 1405
1404
1403
1402
1401
1400

1503
1500
1502
1501

ELECTRONIC MODULE, DISPLAY DEVICE, PHOTOELECTRIC CONVERSION DEVICE, ELECTRONIC APPARATUS, ILLUMINATION DEVICE, MOVING BODY, AND WEARABLE DEVICE

BACKGROUND OF THE INVENTION

Field of the Invention

One disclosed aspect of the embodiments relates to an electronic module, a display device, a photoelectric conversion device, an electronic apparatus, an illumination device, a moving body, and a wearable device.

Description of the Related Art

Japanese Patent Laid-Open No. 2021-87032 discloses a module used in an image capturing device, a display device, or the like. An electrical terminal used for input/output is arranged on an element substrate on which the electronic elements of the module are arranged, and the electrical terminal and a circuit board can electrically be joined.

The joint portion between the electrical terminal and the circuit board can be reinforced using an adhesive to maintain connection reliability and joint strength. A display device such as an organic electroluminescence (EL) display can have a structure in which a circuit board such as a flexible printed board (FPC) is mounted in a bent state. The joint portion between the circuit board and the element substrate with a display unit is reinforced using, for example, an ultraviolet curing resin with elasticity. Productivity and connection reliability can be improved by the reinforcement. However, the ultraviolet (UV) curing resin may cause curing inhibition by oxygen at the time of curing. This is known to pose a problem in that the surface of the adhesive cannot sufficiently be cured.

Even when a popular light-emitting diode type UV irradiator is used, the curing inhibition occurs in some cases. If the UV curing resin inhibited from being cured is exposed for a long time to a high-temperature high-humidity environment, the UV curing resin may contain water. In this case, the water or an unreacted material may be sucked up from the gap between the substrates due to a surface tension and enter the module via the gap. This may degrade quality.

SUMMARY OF THE INVENTION

One disclosed embodiment has been made in consideration of the above-described problem, and it is possible to provide an electronic module having a structure advantageous in suppressing quality degradation.

According to one aspect of the disclosure, there is provided an electronic module. The electronic module comprises a first substrate including a first surface on which an electronic element is arranged, a second surface on an opposite side of the first surface, and a side surface between an edge portion of the first surface and an edge portion of the second surface, and provided with an electrical terminal on a peripheral portion of the first surface, a second substrate including a third surface, a fourth surface on an opposite side of the third surface, and a side surface between an edge portion of the third surface and an edge portion of the fourth surface, a joint member configured to join the first surface of the first substrate and the third surface of the second substrate, a third substrate electrically connected to the electrical terminal of the first substrate, a frame member including a wall portion surrounding a part of the first substrate and a part of the second substrate, and a contact portion having a convex shape and contacting the fourth surface of the second substrate, and a reinforcement member arranged at a point where the electrical terminal and the third substrate are connected.

Further features of the present invention will become apparent from the following description of exemplary embodiments (with reference to the attached drawings).

DESCRIPTION OF THE EMBODIMENTS

Figure 1:
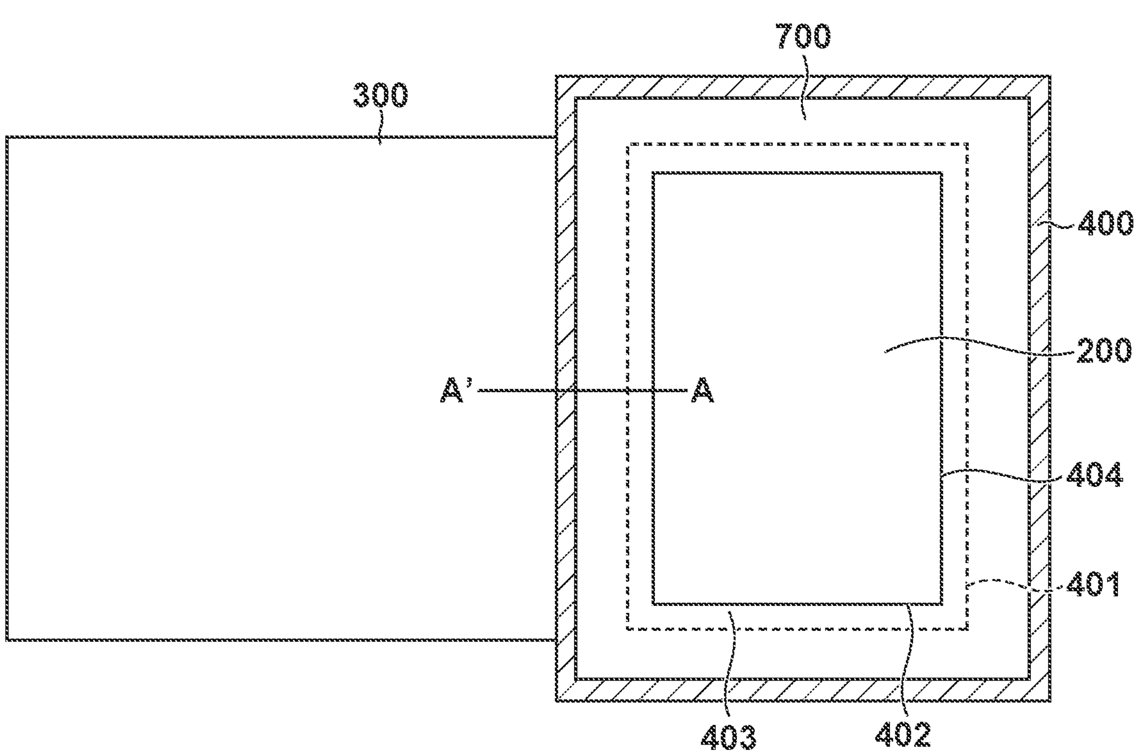
FIG. 1 is a plan view of an electronic device.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

An electronic module according to the first embodiment will be described with reference to FIGS. 1 and 2. The electronic module can include a frame member 400 including a first substrate 100 with an electronic element, and a second substrate 200 joined and bonded to the first substrate. Here, the electronic module will be described using a liquid crystal display unit or a display/light-emitting element including an organic EL element as an example of the electronic element. The second substrate 200 contacts a contact portion 403 of the frame member 400. The portion where the contact portion 403 contacts the second substrate 200 includes a first edge portion 401 in a portion corresponding to the outer edge on the outer side, and a second edge portion 402 in a portion corresponding to the inner edge on the inner side. The contact portion 403 is a portion protruding in a convex shape from the frame member 400. When the contact portion 403 is formed into a convex shape, the contact area to the second substrate 200 can be reduced. Since this facilitates obtaining of dimensional accuracy in mold machining of the frame member 400, a highly accurate electronic device 20 can be supplied.

Using the electronic device 20 as an example, the structure of the electronic module according to this embodiment will be described next with reference to FIG. 2. The electronic device 20 according to this embodiment includes a first substrate 100 with an electronic element arranged on the first principal surface of a silicon or glass substrate, and a second substrate 200 adhered to the first substrate 100 by a joint member 600 such as a transparent epoxy resin or acrylic resin. The second substrate 200 is installed such that its first principal surface faces the first principal surface of the first substrate 100. The second substrate can be a translucent substrate of glass or the like. The second substrate 200 mainly aims at protecting the first substrate 100. The electronic device 20 may include a third substrate 300 formed by a flexible substrate or a glass epoxy substrate and joined, via a gold bump, an anisotropic conductive film, or an anisotropic conductive paste, to an electrical terminal 101 that is arranged on the peripheral portion of the first substrate 100 and used to connect an external electrode. The joint member 600 may join the first principal surface of the first substrate 100 and the first principal surface of the second substrate 200 with the whole surface or only at four corners. These need not always be joined with the whole surface.

The electronic module 10 includes the frame member 400 including a wall portion surrounding the first substrate 100 and the second substrate 200, and a translucent member 700 that enables display by the electronic element mounted on the first substrate 100. The wall portion of the frame member 400 need not be provided at least on a portion where the third substrate 300 is connected. The frame member 400 can play a role of protecting the electronic module. Also, the translucent member 700 can play a role of preventing particles and the like from adhering to the electronic module surface.

The electrical terminal 101 used for connection to the outside is provided on the first substrate 100. The joint portion between the electrical terminal 101 and the third substrate 300 can be reinforced by a reinforcement member 500 such as an ultraviolet curing resin for the purpose of improving reliability. To increase the strength of joint by the reinforcement member 500, the reinforcement member 500 can be arranged to contact the first principal surface of the first substrate 100, the surface of the third substrate 300, and a side surface of the second substrate 200. If the reinforcement member 500 is arranged up to the side surface of the second substrate 200, the reinforcement member 500 is adhered with two surfaces, and therefore, fixing can be done by ensuring a large contact area.

Figure 2:
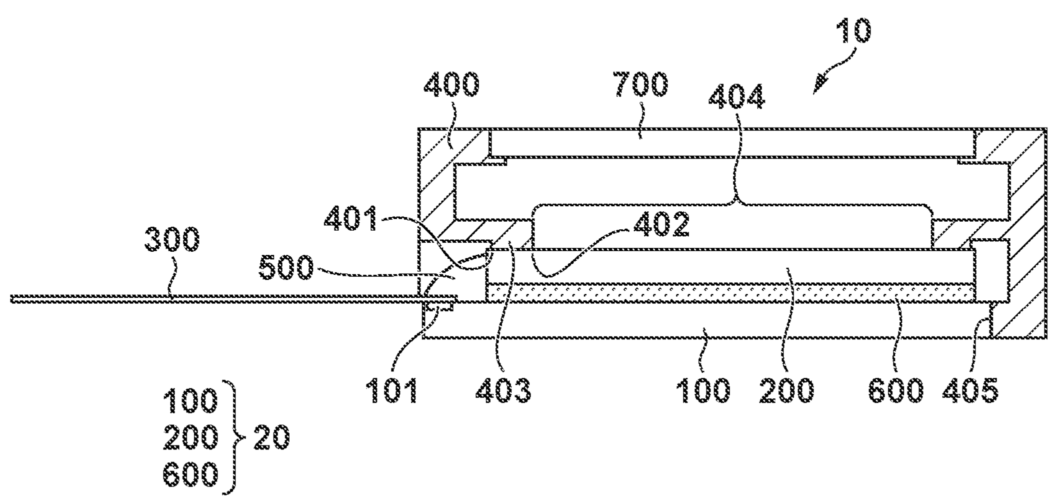
FIG. 2 is a sectional view of an electronic module according to the first embodiment.
Figure 3A:
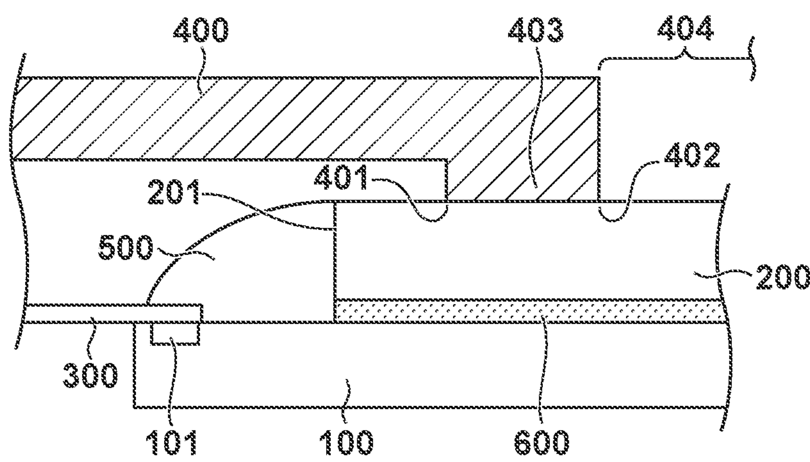
FIG. 3A is an enlarged sectional view of the electronic module according to the first embodiment.
Figure 3B:
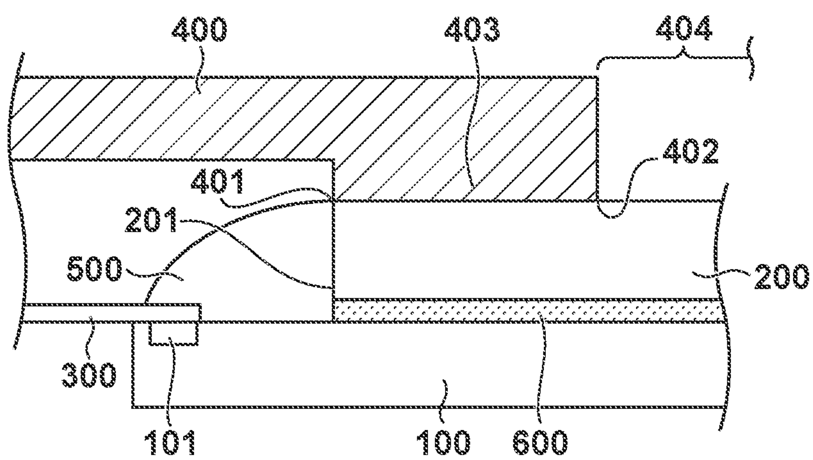
FIG. 3B is an enlarged sectional view of the electronic module according to the first embodiment.

FIGS. 3A and 3B are enlarged sectional views, taken along a line A-A' in FIG. 1, showing the positional relationship between the second substrate 200, the contact portion 403 of the frame member 400, and the reinforcement member 500. The frame member 400 including an inner wall surrounding a part of the electronic device 20 can be made by molding using a material such as modified-PolyPhenyleneEther (modified-PPE), Liquid Crystal Polymer (LCP), or polyamide. The frame member 400 may be provided with an opening portion 404 in accordance with the size of the effective display region of the light-emitting portion of the electronic element to transmit light emitted from the electronic element arranged on the first substrate 100. On the frame member 400, the contact portion 403 having a convex shape along an edge on the side of the contact surface to the second substrate 200 is formed along the periphery of the opening portion 404. The contact portion 403 having the convex shape includes a first edge portion 401 located on the side of an outer side surface 201 of the second substrate 200 on the outer side and a second edge portion 402 located at a position facing the first edge portion 401 on the center side of the second substrate 200, and contact the second substrate.

In the example shown in FIG. 3A, the first edge portion 401 is located at a position retracted from the outer side surface 201 of the second substrate 200 to the center side of the second substrate. When the first edge portion 401 is located inside the side surface 201 of the second substrate 200, contact between the first edge portion 401 of the contact portion 403 and the reinforcement member 500 arranged to reach the side surface 201 of the second substrate 200 to increase the joint strength can be avoided. Note that in this example, the contact portion 403 contacts the second substrate 200 on the whole circumference of the second substrate 200.

The size of the periphery of the second edge portion 402 is decided in accordance with the size of the effective display region of the light-emitting portion of the electronic element arranged on the first substrate 100. When deciding the size of the periphery of the second edge portion 402, the assembly accuracy of the electronic device 20 to the frame member 400 needs to be taken into consideration. As the first substrate 100 with the electronic element arranged, a substrate with a high size accuracy, such as a silicon substrate, can be used. In this case, to raise the assembly accuracy, as shown in FIG. 2, the side surface of the first substrate 100 of the electronic device 20 may be made to contact a reference surface 405 of the wall surface of the frame member 400, and the side surface 201 of the second substrate 200 may be arranged apart from the frame member 400. If the working accuracy of the second substrate 200 is high, the side surface of the second substrate 200 may be made to contact the reference surface provided on the frame member 400.

In the example shown in FIG. 3A, the first edge portion 401 that contacts the second substrate 200 is located inside the side surface 201 of the second substrate 200. To avoid the influence of the reinforcement member 500, the first edge portion 401 can be located at a position apart from the outer side surface 201 of the second substrate 200 by a long distance. However, the longer the distance is, the larger the size of the electronic module is. The distance can be in the range of 0.0 mm to 1.0 mm from the side surface 201 of the second substrate 200, although it depends on the size of the effective display region of the light-emitting portion of the electronic element.

The example shown in FIG. 3B shows a case where the position of the first edge portion 401 that contacts the second substrate 200 matches the plane of the outer side surface 201 of the second substrate 200 in a planar view of the second substrate 200. The reinforcement member 500 that reinforces the joint portion of the electrical terminal 101 is arranged on the side surface of the second substrate 200 as well. In this case, if the reinforcement member 500 does not reach the second principal surface on the opposite side of the first principal surface of the second substrate 200, the first edge portion 401 and the reinforcement member 500 do not contact. It is therefore possible to suppress outflow of water or an unreacted material of the reinforcement member 500 to the gap between the contact portion 403 and the second substrate 200. Even if the reinforcement member 500 reaches the second principal surface, the reinforcement member 500 and the frame member 400 are separated by the contact portion 403 having the convex shape, and a space exists therebetween. For this reason, a surface tension generated on the surface of the reinforcement member by the unreacted material or water can be dispersed. As a result, the surface tension toward the gap between the contact portion 403 and the second substrate 200 can be reduced. Hence, it is possible to suppress entry of the unreacted material or water from the gap between the contact portion 403 and the second substrate 200 to the side of the second principal surface of the second substrate 200.

In addition, when C chamfering is performed to obliquely cut the edge along the whole edge line on the side of the second principal surface of the second substrate 200, the position of the reinforcement member 500 can be set to a position closer to the first substrate 100 than the position of chamfering. Since the height of the reinforcement member 500 in contact with the side surface of the second substrate 200 can be suppressed, entry of water or the unreacted material of the reinforcement member 500 into the gap can be suppressed. Hence, C chamfering can be applied to the edge line of the second substrate 200.

Figure 4:
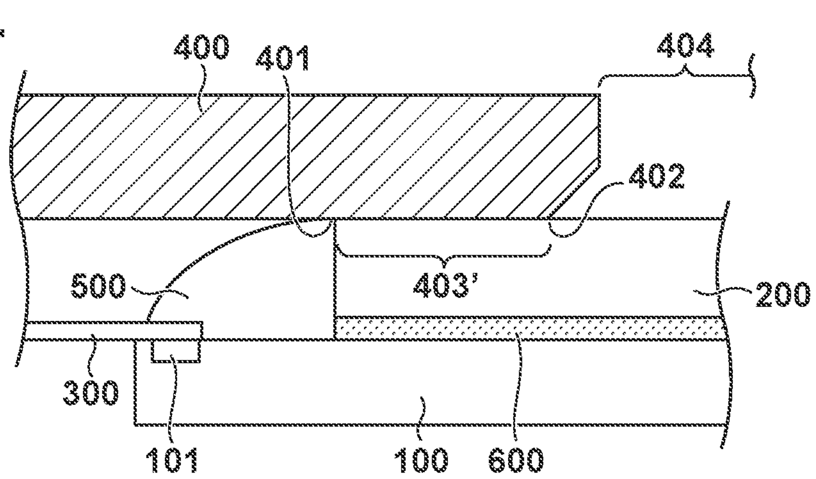
FIG. 4 is a sectional view showing a comparative example of the electronic module.

FIG. 4 shows a comparative example so as explain a case where the contact portion 403 having the convex shape is not provided. The comparative example of FIG. 4 shows an example in which the frame member 400 contacts the second substrate 200 with a contact surface 403'. When the reinforcement member 500 is applied, it may reach the edge of the contact surface 403'. At this time, in the comparative example shown in FIG. 4, since a contact portion having a convex shape, which forms a space between the reinforcement member and the frame member, is not provided, unlike the example shown in FIG. 3B, the gap between the reinforcement member 500 and the frame member 400 almost disappears. Then, the surface tension is not dispersed on the surface of the reinforcement member 500, and the direction in which the surface tension acts is limited. The surface tension pushes the unreacted material or water that appears in the gap where the reinforcement member 500 and the frame member 400 contact toward the gap where the frame member 400 and the second substrate 200 contact. As a result, the unreacted material or water enters the second principal surface of the second substrate 200 via the gap. The unreacted material or water that has entered may ooze to the effective display region of the electronic element arranged on the first substrate 100 to degrade the display quality.

Hence, the contact portion 403 having the convex shape is provided on the frame member 400, as in this embodiment, thereby suppressing quality degradation of the electronic module.

Second Embodiment

Figure 5:
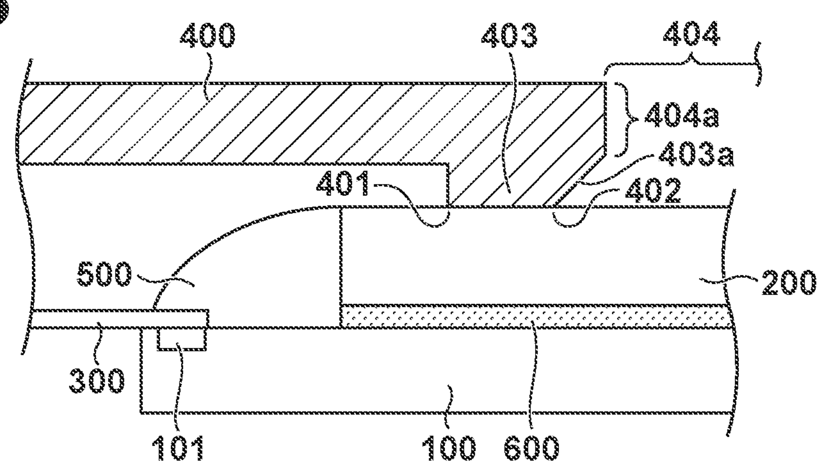
FIG. 5 is an enlarged sectional view of an electronic module according to the second embodiment.

As a modification of the first embodiment, the second embodiment will be described with reference to FIG. 5. As for the configuration of an electronic module, a detailed description of the same parts as in the first embodiment will be omitted, and only different points will mainly be described. This embodiment is different from the first embodiment in the shape of a contact portion 403 on the side of a second edge portion 402, which contacts a second substrate 200. The second edge portion 402 of the contact portion 403 contacts a part of the second substrate 200. The contact portion 403 is provided with a tapered portion **403*a* having a tapered shape from an opening portion 404 to the outside of the second substrate 200. The tapered portion 403*a* has a shape heading to the center side of the second substrate 200 in accordance with the distance from the second substrate in the vertical direction. That is, when the tapered portion 403*a* is provided, the linear portion of an end face 404*a* of the frame member 400 on the side of opening portion 404** can be made short.

When the tapered portion **403*a* is provided, burrs or thread-like burrs generated on the edge line along the opening portion 404 at the time of molding of the frame member 400 can be suppressed. It is therefore possible to form a sharp edge for the opening portion 404. The linear portion of the end face 404*a* of the contact portion 403 on the side of the opening portion 404 can be made short. For this reason, since the perpendicularity to the second substrate 200 can readily be improved when manufacturing the mold of the frame member 400, the dimensional accuracy can also be improved. Also, when the contact area between the contact portion 403 and the second substrate 200 is reduced, the plane accuracy of the contact portion of the frame member can be improved. Hence, the quality can be improved. When using a liquid crystal polymer for the frame member 400, a material grade of crystal as short as 50 μm or less can be selected to suppress burrs or thread-like burrs on the edge line of the opening portion 404**.

Third Embodiment

Figure 6:
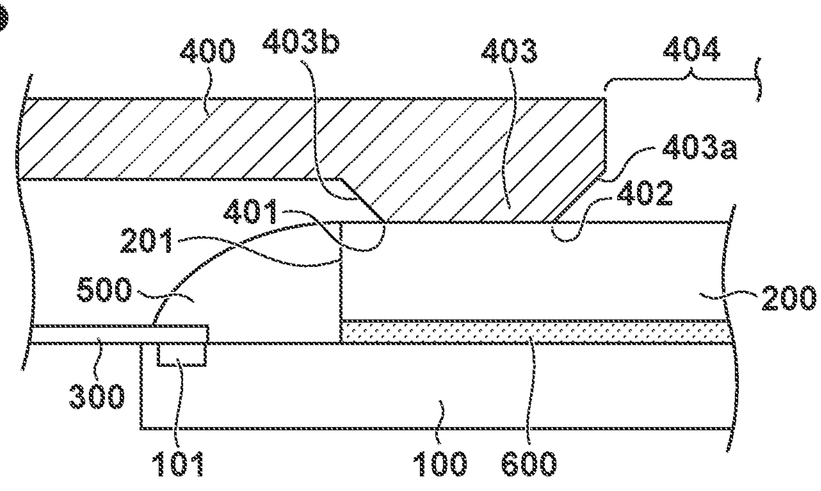
FIG. 6 is an enlarged sectional view of an electronic module according to the third embodiment.

As another modification of the first embodiment, the third embodiment will be described with reference to FIG. 6. As for the configuration of an electronic module, a detailed description of the same parts as in the first embodiment will be omitted. FIG. 6 shows an example in which the shape of a contact portion 403 on the side of a first edge portion 401, which contacts a second substrate 200, is different from the first and second embodiments.

The first edge portion 401 of the contact portion 403 contacts a part of the second substrate 200. At this time, a tapered portion **403*b* having a tapered shape heading inward from a position corresponding to the side surface 201 of the second substrate 200 is provided on the contact portion 403. The tapered portion 403*b* has a shape heading outward with respect to the side surface 201 of the second substrate 200 in accordance with the distance from the second substrate in the vertical direction. That is, the contact portion 403 includes the tapered portion 403*b* that becomes far from the side surface 201 from the first edge portion 401 to the outside of the second substrate 200**.

Since the first edge portion 401 can thus be located at a position farther from the side surface 201 of the second substrate 200, the distance between a frame member 400 and a reinforcement member 500 can further be increased. Hence, water or the unreacted material of the reinforcement member 500 hardly enters the contact portion, and quality degradation can be suppressed.

In this example as well, the contact portion of the frame member 400 to the second substrate 200 is located on the center side of the second substrate 200. Since contact between the reinforcement member 500 and the contact portion 403 of the frame member 400 can be avoided, a high-quality electronic module can be provided.

Application examples of an electronic module 10 functioning as a light-emitting device in which an organic light-emitting (organic EL) element that is a light-emitting element is arranged as an electronic element will be described next with reference to FIGS. 7 to 11A and 11B. Embodiments to be described as the application examples are examples in which the electronic module 10 according to the first to third embodiments is applied to a display device, a photoelectric conversion device, an electronic apparatus, an illumination device, a moving body, and a wearable device. After describing details and modifications of the components of the electronic module 10 functioning as the above-described light-emitting device, the application examples will be explained.

Configuration of Organic Light-Emitting Element

The organic light-emitting element is formed by forming an insulating layer, a first electrode, an organic compound layer, and a second electrode on a substrate. A protection layer, a color filter, a microlens, and the like may be provided on a cathode. If a color filter is provided, a planarizing layer can be provided between the protection layer and the color filter. The planarizing layer can be made of acrylic resin or the like. The same applies to a case in which a planarizing layer is provided between the color filter and the microlens.

Substrate

Quartz, glass, a silicon wafer, a resin, a metal, or the like may be used as a substrate. Furthermore, a switching element such as a transistor and a wiring may be provided on the substrate, and an insulating layer may be provided thereon. The insulating layer can be made of any material as long as a contact hole can be formed so that the wiring can be formed between the insulating layer and the first electrode and insulation from the unconnected wiring can be ensured. For example, a resin such as polyimide, silicon oxide, silicon nitride, or the like can be used.

Electrodes

A pair of electrodes can be used as the electrodes. The pair of electrodes can be an anode and a cathode. When an electric field is applied in the direction in which the organic light-emitting element emits light, the electrode having a high potential is the anode, and the other is the cathode. It can also be said that the electrode that supplies holes to the light-emitting layer is the anode and the electrode that supplies electrons is the cathode.

As the constituent material of the anode, a material having a work function as large as possible can be used. For example, a metal such as gold, platinum, silver, copper, nickel, palladium, cobalt, selenium, vanadium, or tungsten, or a mixture containing some of these is used. Alternatively, an alloy obtained by combining some of these, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of these may be used in combination. The anode may be formed by a single layer or a plurality of layers.

When the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. When the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function can be used. Examples of the material include an alkali metal such as lithium, an alkaline earth metal such as calcium, a metal such as aluminum, titanium, manganese, silver, lead, or chromium, and a mixture containing some of these. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of these may be used in combination. The cathode may have a single-layer structure or a multi-layer structure. In particular, silver can be used. To suppress aggregation of silver, a silver alloy can be used. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is used to provide the good film coverage and easily lower the resistance.

Organic Compound Layer

The organic compound layer may be formed by a single layer or a plurality of layers. If the organic compound layer includes a plurality of layers, the layers can be called a hole injection layer, a hole transport layer, an electron blocking layer, a light-emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first and second electrodes, and may be arranged in contact with the first and second electrodes.

Protection Layer

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 μm by the CVD method. The protection layer may be provided using an atomic layer deposition method (ALD method) after forming a film using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness of the film formed by the ALD method may be 50% or less, or 10% or less.

Color Filter

A color filter may be provided on the protection layer. For example, a color filter considering the size of the organic light-emitting element may be provided on another substrate, and this substrate may be bonded to the substrate with the organic light-emitting element provided thereon. Alternatively, a color filter may be patterned on the above-described protection layer using a photolithography technique. The color filter may be formed from polymer material.

Planarizing Layer

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of low-molecular material or polymer material. It is better to use polymer material.

The planarizing layers may be provided above and below the color filter, and the same or different materials may be used for these. More specifically, examples of the material include polyvinyl carbazole resin, polycarbonate resin, polyester resin, ABS resin, acrylic resin, polyimide resin, phenol resin, epoxy resin, silicone resin, and urea resin.

Microlens

The light-emitting device can include an optical member such as a microlens on the light emission side. The microlens can be made of acrylic resin, epoxy resin, or the like. The microlens can aim to increase the amount of light extracted from the light-emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircular of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

Counter Substrate

A counter substrate can be provided on the planarizing layer. The counter substrate is called a counter substrate because it is provided at a position facing the above-described substrate. The constituent material of the counter substrate can be the same as that of the above-described substrate. When a substrate on which an electronic element is arranged is the first substrate, the counter substrate can be the second substrate.

Organic Layer

The organic compound layer (hole injection layer, hole transport layer, electron blocking layer, light-emitting layer, hole blocking layer, electron transport layer, electron injection layer, and the like) forming the organic light-emitting element according to an embodiment of the present invention is formed by the method to be described below.

The organic compound layer forming the organic light-emitting element according to the embodiment of the present invention can be formed by a dry process using a vacuum deposition method, an ionization vapor deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to these.

One of these binder resins may be used singly as a homopolymer or a copolymer, or two or more of these may be used in combination. Furthermore, additives such as a well-known plasticizer, antioxidant, and an ultraviolet absorber may also be used as needed.

Pixel Circuit

The light-emitting device can include a pixel circuit connected to the light-emitting element. The pixel circuit may be an active matrix circuit that individually controls light emission of the first and second light-emitting elements. The active matrix circuit may be a voltage or current programing circuit. A driving circuit includes a pixel circuit for each pixel. The pixel circuit can include a light-emitting element, a transistor for controlling light emission luminance of the light-emitting element, a transistor for controlling a light emission timing, a capacitor for holding the gate voltage of the transistor for controlling the light emission luminance, and a transistor for connection to GND without intervention of the light-emitting element.

The light-emitting device includes a display region and a peripheral region arranged around the display region. The light-emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light-emitting element such as the first light-emitting element.

Pixel

The organic light-emitting device includes a plurality of pixels. Each pixel includes sub-pixels that emit light components of different colors. The sub-pixels include, for example, Red (R), Green (G), and Blue (B) emission colors, respectively.

In each pixel, a region also called a pixel opening emits light. This region is the same as the first region. The pixel opening can have a size of 5 μm (inclusive) to 15 μm (inclusive). More specifically, the pixel opening can have a size of 11 μm, 9.5 μm, 7.4 μm, 6.4 μm, or the like.

A distance between the sub-pixels can be 10 μm or less, and can be, more specifically, 8 μm, 7.4 μm, or 6.4 μm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle. The shape of the sub-pixel and the pixel arrangement can be used in combination.

Application Purposes of Organic Light-Emitting Element According to One Embodiment of Present Invention The organic light-emitting element according to an embodiment of the present invention can be used as a constituent member of a display device or an illumination device. In addition, the organic light-emitting element is applicable to the exposure light source of an electrophotographic image forming device, the backlight of a liquid crystal display device, a light-emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

A detailed description will be made below with reference to FIGS. 7 to 11A and 11B.

Figure 7:
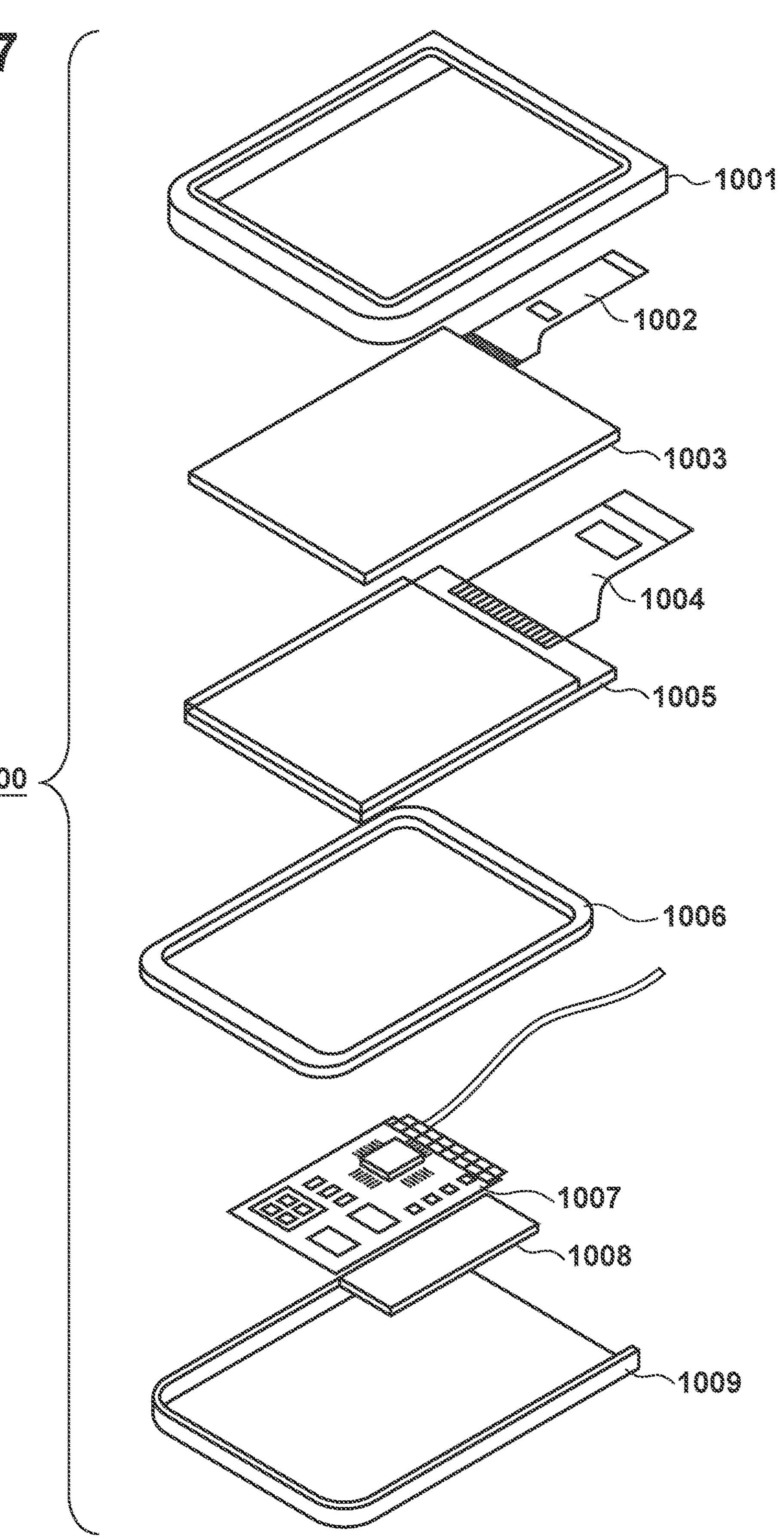
FIG. 7 is a schematic view showing an example of a display device.

FIG. 7 is a schematic view showing an example of a display device using the electronic module 10 functioning as a light-emitting device according to this embodiment. A display device 1000 may include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. Even when the display device 1000 is a portable apparatus, the battery 1008 need not be provided at this position. The electronic module 10 can be applied to the display panel 1005. The pixel region of the electronic module 10 on which the light-emitting element functioning as the display panel 1005 is connected to the active elements such as transistors arranged on the circuit board 1007 and operates.

The display device 1000 shown in FIG. 7 can be used for a display unit of a photoelectric conversion device (image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

Figure 8A:
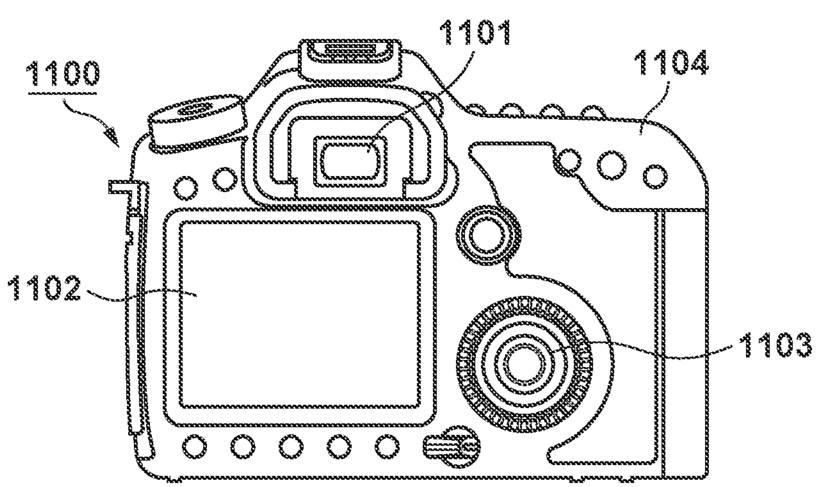
FIG. 8A is a schematic view showing an example of an image capturing device.

FIG. 8A is a schematic view showing an example of a photoelectric conversion device using the electronic module 10 functioning as a light-emitting device according to this embodiment. A photoelectric conversion device 1100 can include a viewfinder 1101, a rear display 1102, an operation unit 1103, and a housing 1104. The photoelectric conversion device 1100 can also be called an image capturing device. The electronic module 10 according to this embodiment can be applied to the viewfinder 1101 or the rear display 1102 as a display unit. In this case, the pixel region of the electronic module 10 may display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time, so it is better to display the information as soon as possible. Therefore, the electronic module 10 functioning as a light-emitting device in which an organic light-emitting material such as an organic EL element is arranged in each pixel may be used for the viewfinder 1101 or the rear display 1102. This is because the organic light-emitting material has a high response speed. The electronic module functioning as a light-emitting device using the organic light-emitting material is more suitable than the liquid crystal display for the apparatuses that require a high display speed.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The electronic module 10 functioning as a light-emitting device may be applied to a display unit of an electronic apparatus. At this time, the display unit can have both a display function and an operation function. Examples of the portable terminal are a portable phone such as a smartphone, a tablet, and a head mounted display.

Figure 8B:
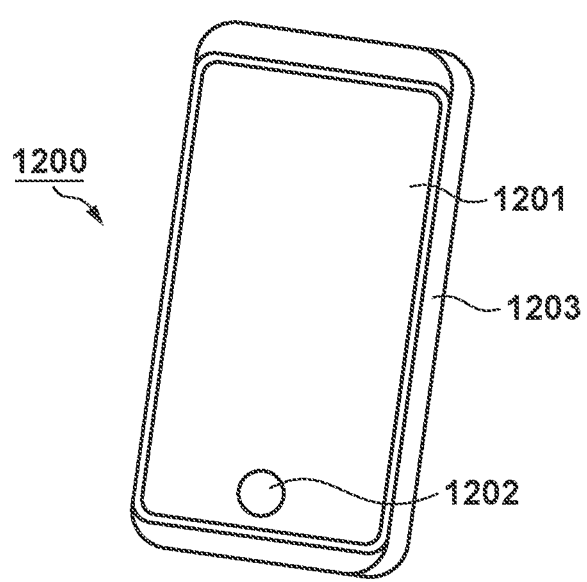
FIG. 8B is a schematic view showing an example of an electronic device.

FIG. 8B is a schematic view showing an example of an electronic apparatus using the electronic module 10 functioning as a light-emitting device according to this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The electronic module 10 according to this embodiment can be applied to the display unit 1201.

Figure 9A:
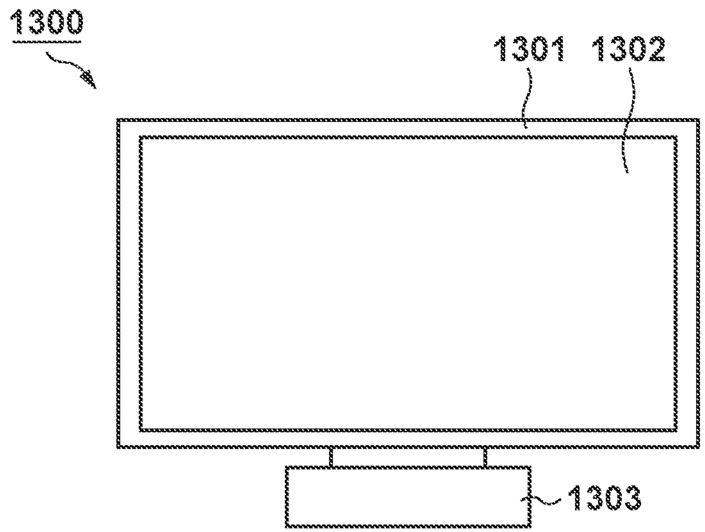
FIG. 9A is a schematic view showing an example of a display device.
Figure 9B:
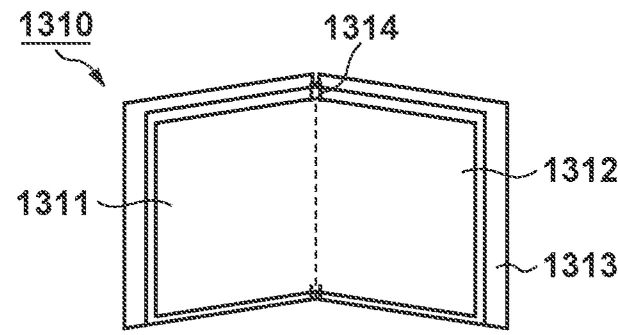
FIG. 9B is a schematic view showing an example of a foldable display device.

FIGS. 9A and 9B are schematic views showing examples of the display device using the electronic module 10 functioning as a light-emitting device according to this embodiment. FIG. 9A shows a display device such as a television monitor or a PC monitor. A display device 1300 includes a frame 1301 and a display unit 1302. The electronic module 10 according to this embodiment can be applied to the display unit 1302. The display device 1300 can include a base 1303 that supports the frame 1301 and the display unit 1302. The base 1303 is not limited to the form shown in FIG. 9A. For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 9B is a schematic view showing another example of the display device using the electronic module 10 functioning as a light-emitting device according to this embodiment. A display device 1310 shown in FIG. 9B can be folded, and is a so-called foldable display device. The display device 1310 includes a first display unit 1311, a second display unit 1312, a housing 1313, and a bending point 1314. The electronic module 10 according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 10A:
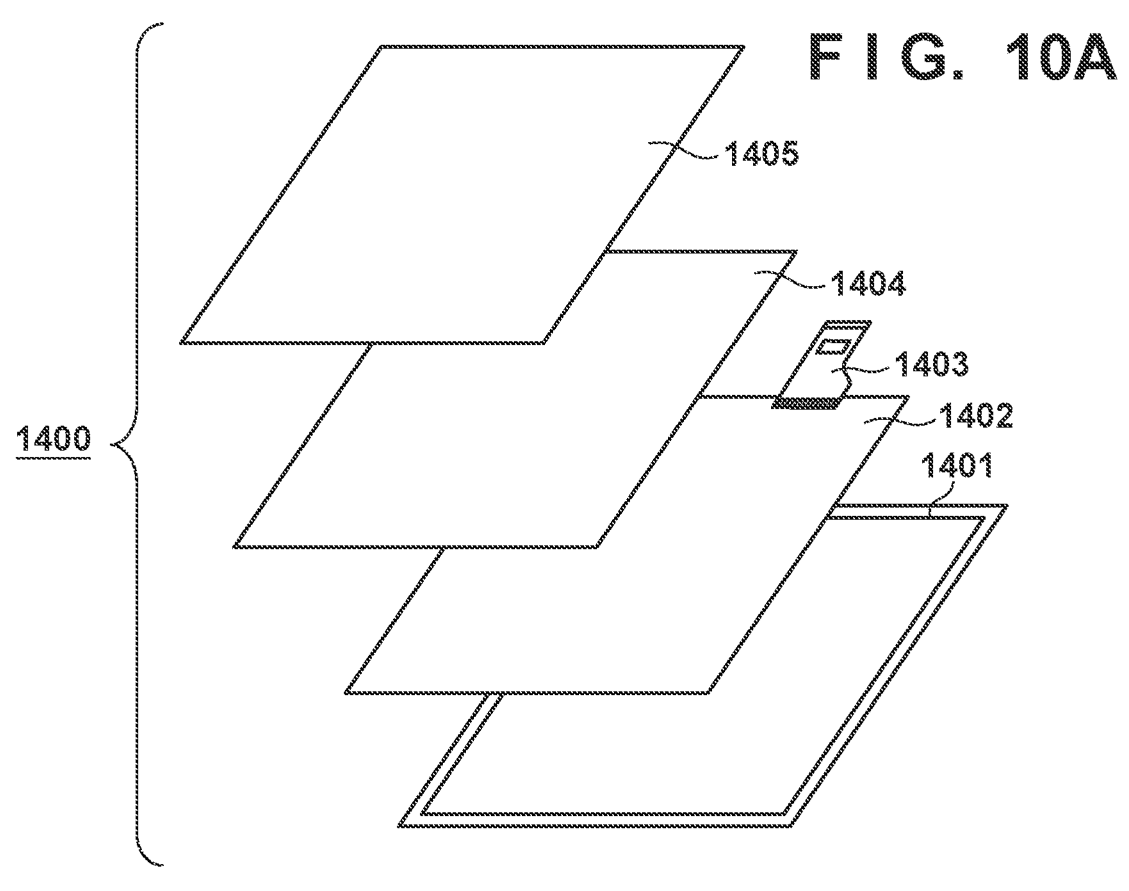
FIG. 10A is a schematic view showing an example of an illumination device.

FIG. 10A is a schematic view showing an example of an illumination device using the electronic module 10 functioning as a light-emitting device according to this embodiment. An illumination device 1400 can include a housing 1401, a light source 1402, a circuit board 1403, an optical film 1404, and a light diffuser 1405. The electronic module 10 according to this embodiment can be applied to the light source 1402. The optical film 1404 can be a filter that improves the color rendering of the light source. When performing lighting-up or the like, the light diffuser 1405 can throw the light of the light source over a broad range by effectively diffusing the light. The illumination device 1400 can also include a cover on the outermost portion, as needed. The illumination device 1400 can include both or one of the optical film 1404 and the light diffuser 1405.

The illumination device 1400 may be a device for illuminating the interior of the room. The illumination device 1400 can emit white light, natural white light, or light of any color from blue to red. The illumination device 1400 can also include a light control circuit for controlling these light components. The illumination device 1400 may include a power supply circuit connected to the pixel region of the electronic module 10 functioning as the light source 1402. The power supply circuit is a circuit for converting an AC voltage into a DC voltage. White has a color temperature of 4,200 K, and natural white has a color temperature of 5,000 K. The illumination device 1400 may also include a color filter. In addition, the illumination device 1400 can include a heat radiation unit. The heat radiation unit radiates the internal heat of the device to the outside of the device, and examples are a metal having a high specific heat and liquid silicon.

Figure 10B:
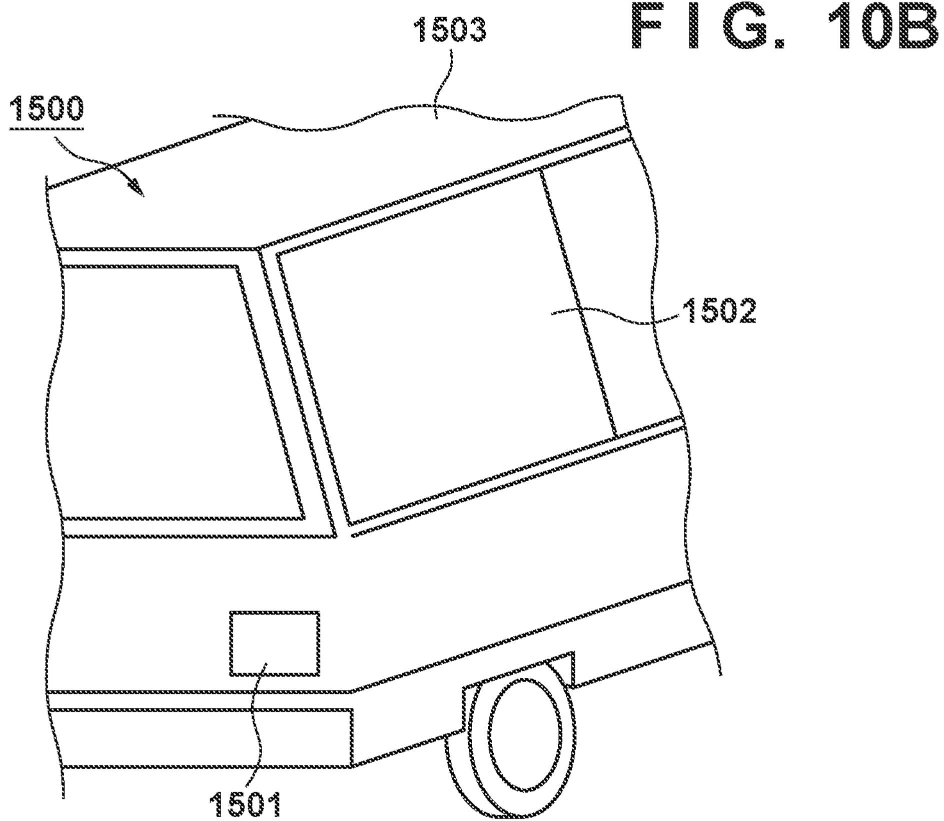
FIG. 10B is a schematic view showing an example of an automobile including a vehicle lighting unit.

FIG. 10B is a schematic view of an automobile having a taillight as an example of a vehicle lighting unit using the electronic module 10 functioning as a light-emitting device according to this embodiment. An automobile 1500 has a taillight 1501, and can have a form in which the taillight 1501 is turned on when performing a braking operation or the like. The electronic module 10 according to this embodiment may be used as a headlight serving as a vehicle lighting unit. The automobile is an example of a moving body, and the moving body may be a ship, a drone, an aircraft, a railroad car, an industrial robot, or the like. The moving body may include a main body and a lighting unit provided in the main body. The lighting unit may be used to make a notification of the current position of the main body.

The electronic module 10 functioning as a light-emitting device according to this embodiment can be applied to the taillight 1501. The taillight 1501 may include a protection member for protecting the pixel region of the electronic module 10 functioning as the taillight 1501. The material of the protection member is not limited as long as the material is a transparent material with a strength that is high to some extent, and an example is polycarbonate. A furandicarboxylic acid derivative, an acrylonitrile derivative, or the like may be mixed in polycarbonate for the protection member.

The automobile 1500 can include a vehicle body 1503, and a window 1502 attached to the vehicle body 1503. This window can be a window for checking the front and back of the automobile, and can also be a transparent display. For this transparent display, the electronic module 10 functioning as a light-emitting device according to this embodiment may be used. In this case, the constituent materials of the electrodes and the like of the electronic module 10 are formed by transparent members.

Figure 11A:
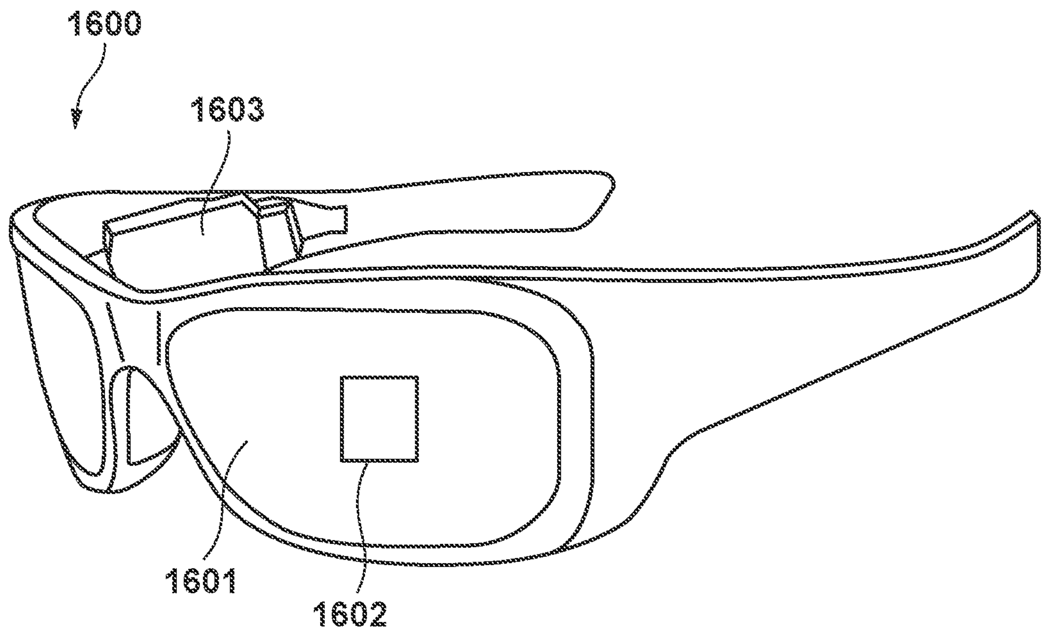
FIG. 11A is a schematic view showing an example of a wearable device.
Figure 11B:
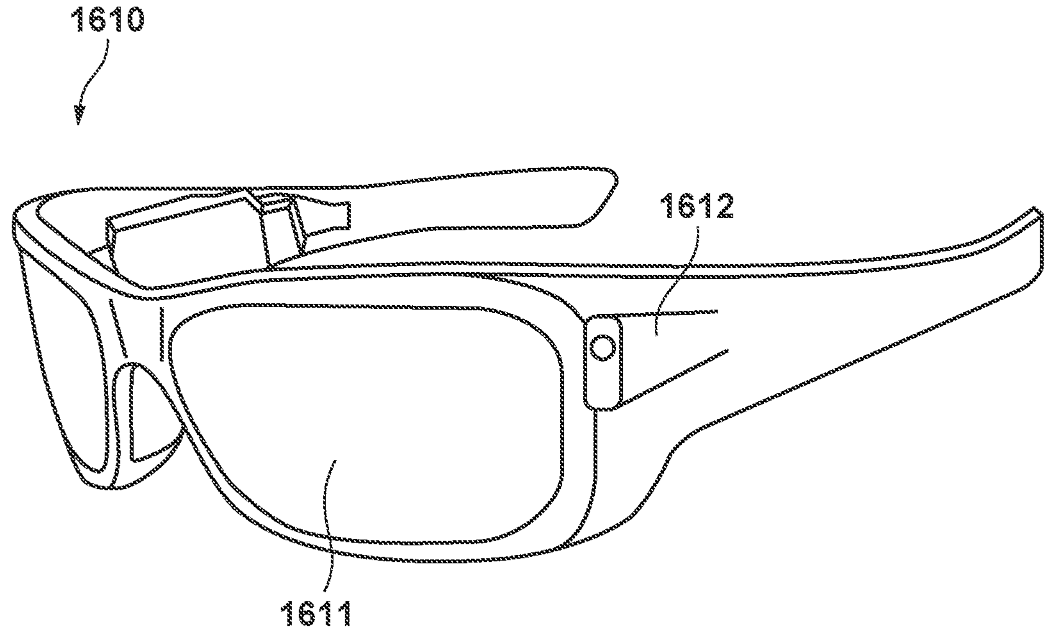
FIG. 11B is a schematic view showing an example of a wearable device including an image capturing device.

Further application examples of the electronic module functioning as a light-emitting device according to this embodiment will be described with reference to FIGS. 11A and 11B. The electronic module functioning as a light-emitting device can be applied to a system that can be worn as a wearable device such as smartglasses, an HMD (Head Mounted Display), or a smart contact lens. An image capturing display device used for such application examples can include an image capturing device capable of photoelectrically converting visible light and a light-emitting device capable of emitting visible light.

Glasses 1600 (smartglasses) according to one application example will be described with reference to FIG. 11A. An image capturing device 1602 such as a CMOS (complementary metal-oxide semiconductor) sensor or an SPAD (Single Photon Avalanche Diode) sensor is provided on the surface side of a lens 1601 of the glasses 1600. In addition, the electronic module 10 functioning as a light-emitting device according to this embodiment is provided on the back surface side of the lens 1601.

The glasses 1600 further includes a control device 1603. The control device 1603 functions as a power supply that supplies electric power to the image capturing device 1602 and the electronic module 10 according to this embodiment. In addition, the control device 1603 controls the operations of the image capturing device 1602 and the electronic module 10. The lens 1601 forms an optical system configured to condense light to the image capturing device 1602.

Glasses 1610 (smartglasses) according to one application example will be described with reference to FIG. 11B. The glasses 1610 includes a control device 1612, and an image capturing device corresponding to the image capturing device 1602 and the electronic module 10 functioning as a light-emitting device are mounted on the control device 1612. The image capturing device in the control device 1612 and an optical system configured to project light emitted from the electronic module 10 are formed in a lens 1611, and an image is projected to the lens 1611. The control device 1612 functions as a power supply that supplies electric power to the image capturing device and the electronic module 10, and controls the operations of the image capturing device and the electronic module 10.

The control device 1612 may include a line-of-sight detection unit that detects the line-of-sight of a wearer. The detection of a line-of-sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line-of-sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on a pupil corneal reflection method is performed. Using the pupil corneal reflection method, a line-of-sight vector representing the direction (rotation angle) of the eyeball is calculated based on the image of the pupil and the Purkinje image included in the captured image of the eyeball, thereby detecting the line-of-sight of the user.

The electronic module 10 functioning as a light-emitting device according to an embodiment of the present invention may include an image capturing device including a light receiving element, and control a displayed image based on the line-of-sight information of the user from the image capturing device.

More specifically, the electronic module 10 decides a first visual field region at which the user is gazing and a second visual field region other than the first visual field region based on the line-of-sight information. The first visual field region and the second visual field region may be decided by the control device of the electronic module 10, or those decided by an external control device may be received by the image capturing device. In the display region of the electronic module 10, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the electronic module 10, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line-of-sight and the distance to a target ahead the line-of-sight from the image of the eyeball using the image of the eyeball and the direction of actual viewing of the eyeball in the image as supervised data. The AI program may be held by the electronic module 10, the image capturing device, or an external device. If the external device holds the AI program, the determination of the AI is transmitted to the electronic module 10 via communication.

When performing display control based on line-of-sight detection, smartglasses further including an image capturing device configured to capture the outside can be applied. The smartglasses can display captured outside information in real time.

Terms in this specification are merely used for the purpose of explaining the present invention and can include equivalents thereof. The present invention is not limited to the strict meanings of the terms.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-072671, filed Apr. 26, 2022, which is hereby incorporated by reference herein in its entirety.

What is claimed is:

1. An electronic module comprising:

a first substrate including (1) a first surface on which an electronic element is arranged, (2) a second surface on an opposite side of the first surface, and (3) a side surface between an edge portion of the first surface and an edge portion of the second surface, the first substrate being provided with an electrical terminal on a peripheral portion of the first surface;

a second substrate including (1) a third surface, (2) a fourth surface on an opposite side of the third surface, and (3) a side surface between an edge portion of the third surface and an edge portion of the fourth surface;

a joint member configured to join the first surface of the first substrate and the third surface of the second substrate;

a third substrate electrically connected to the electrical terminal of the first substrate;

a frame member including (1) a wall portion surrounding a part of the first substrate and a part of the second substrate and (2) a contact portion having a convex shape and contacting the fourth surface of the second substrate; and a reinforcement member arranged at a point where the electrical terminal and the third substrate are connected, wherein the reinforcement member is in contact with the side surface of the second substrate, wherein the frame member includes a fifth surface facing toward the first surface of the first substrate, and wherein the fifth surface includes (1) a sixth surface being in contact with the fourth surface of the second substrate and (2) a seventh surface being overlapped with the second substrate with a gap in a direction perpendicular to the first surface.

2. The module according to claim 1, wherein the contact portion includes (1) an inner edge on a side close to a center of the second substrate, and (2) an outer edge on an opposite side of the inner edge, and wherein the outer edge is arranged at a position matching the side surface of the second substrate in a planar view or at a position closer to the center of the second substrate than the side surface of the second substrate.

3. The module according to claim 1, wherein the contact portion contacts a whole circumference of the fourth surface of the second substrate.

4. The module according to claim 1, wherein at least a part of the side surface of the first substrate contacts the wall portion of the frame member.

5. The module according to claim 1, wherein the contact portion includes a shape heading to the center of the second substrate in accordance with a distance from the second substrate in a vertical direction.

6. The module according to claim 1, wherein the contact portion includes a shape heading outward with respect to the side surface of the second substrate in accordance with a distance from the second substrate in a vertical direction.

7. The module according to claim 1, wherein the side surface of the second substrate is apart from the wall portion of the frame member.

8. The module according to claim 1, wherein the second substrate is a translucent substrate.

9. The module according to claim 1, wherein the joint member is an acrylic resin.

10. The module according to claim 1, wherein the reinforcement member is an ultraviolet curing resin.

11. The module according to claim 1, wherein the electronic element includes a light-emitting element.

12. A display device comprising:

the module according to claim 11; and an active element connected to the module.

13. A photoelectric conversion device comprising:

an optical unit including a plurality of lenses;

an image sensor configured to receive light having passed through the optical unit; and a display unit configured to display an image received by the image sensor, wherein the display unit includes the module according to claim 11.

14. An electronic apparatus comprising:

a housing provided with a display unit; and a communication unit provided in the housing and configured to perform external communication, wherein the display unit includes the module according to claim 11.

15. An illumination device comprising:

a light source; and at least one of a light diffuser and an optical film, wherein the light source includes the module according to claim 11.

16. A moving body comprising:

a main body; and a lighting unit provided in the main body, wherein the lighting unit includes the module according to claim 11.

17. A wearable device comprising:

a display device configured to display an image, wherein the display device includes the module according to claim 11.

18. The module according to claim 1, wherein the contact portion comprises (1) an eighth surface contacting the fourth surface and (2) an inclined portion that is inclined with respect to the first surface.

19. The module according to claim 18, wherein a width of the inclined portion decreases toward the first surface.

20. The module according to claim 1, wherein the reinforcement member is in contact with (1) the first surface of the first substrate and (2) a surface of the third substrate.

* * * * *